(12) United States Patent
Yamamoto et al.

(10) Patent No.: US 10,374,345 B2
(45) Date of Patent: Aug. 6, 2019

(54) ELECTRONIC DEVICE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventors: Nobuhiro Yamamoto, Yokohama Kanagawa (JP); Kota Tokuda, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/915,707

(22) Filed: Mar. 8, 2018

(65) Prior Publication Data

US 2018/0337477 A1 Nov. 22, 2018

(30) Foreign Application Priority Data

May 19, 2017 (JP) .................................. 2017-099956

(51) Int. Cl.
| | | |
|---|---|---|
| *H01R 12/79* | (2011.01) | |
| *H01R 12/78* | (2011.01) | |
| *H01R 13/24* | (2006.01) | |
| *H05K 5/02* | (2006.01) | |
| *H05K 1/02* | (2006.01) | |
| *H05K 5/06* | (2006.01) | |

(Continued)

(52) U.S. Cl.
CPC ........... *H01R 12/79* (2013.01); *G11B 25/043* (2013.01); *G11B 33/022* (2013.01); *G11B 33/122* (2013.01); *H01R 12/78* (2013.01); *H01R 13/2407* (2013.01); *H05K 1/028* (2013.01); *H05K 1/147* (2013.01); *H05K 1/189* (2013.01); *H05K 3/365* (2013.01); *H05K 5/0247* (2013.01); *H05K 5/065* (2013.01); *H05K 5/069* (2013.01); *H05K 1/118* (2013.01); *H05K 2201/042* (2013.01); *H05K 2201/056* (2013.01); *H05K 2201/09409* (2013.01); *H05K 2201/10189* (2013.01)

(58) Field of Classification Search
USPC .................................................. 361/749, 748
See application file for complete search history.

(56) References Cited

U.S. PATENT DOCUMENTS

| | | |
|---|---|---|
| 5,760,997 A | 6/1998 | Koyanagi et al. |
| 6,678,112 B1 | 1/2004 | Kaneko |

(Continued)

FOREIGN PATENT DOCUMENTS

| | | |
|---|---|---|
| JP | 08106761 A | 4/1996 |
| JP | 2000331471 A | 11/2000 |

(Continued)

*Primary Examiner* — Andargie M Aychillhum
(74) *Attorney, Agent, or Firm* — Holtz, Holtz & Volek PC

(57) ABSTRACT

According to one embodiment, an electronic device includes a casing, a flexible wiring member, and a first electrical component, for example. The casing is provided with an opening. The flexible wiring member includes an insulating film, a lead mounted on the insulating film, and a connection terminal, and extends through the opening. The sealant is filled in the opening. The first electrical component is encapsulated by the casing and electrically connected to a second electrical component outside the casing through the flexible wiring member.

17 Claims, 17 Drawing Sheets

(51) Int. Cl.
*H05K 1/18* (2006.01)
*H05K 1/14* (2006.01)
*G11B 33/02* (2006.01)
*G11B 25/04* (2006.01)
*G11B 33/12* (2006.01)
*H05K 3/36* (2006.01)
*H05K 1/11* (2006.01)

(56) References Cited

U.S. PATENT DOCUMENTS

| | | |
|---|---|---|
| 9,704,539 B2 | 7/2017 | Sudo et al. |
| 9,721,619 B2 | 8/2017 | Sudo et al. |
| 2008/0285243 A1* | 11/2008 | Kagawa ............... G11B 25/043 361/749 |
| 2015/0257293 A1 | 9/2015 | Hirano et al. |

FOREIGN PATENT DOCUMENTS

| | | |
|---|---|---|
| JP | 2008287809 A | 11/2008 |
| JP | 2009176904 A | 8/2009 |
| JP | 2010021173 A | 1/2010 |
| JP | 2012246376 A | 12/2012 |
| JP | 2015181080 A | 10/2015 |

* cited by examiner

ELECTRONIC DEVICE

CROSS-REFERENCE TO RELATED APPLICATIONS

This application is based upon and claims the benefit of priority from Japanese Patent Application No. 2017-099956, filed May 19, 2017, the entire contents of which are incorporated herein by reference.

FIELD

Embodiments described herein relate generally to an electronic device.

BACKGROUND

Conventionally, electronic devices with a casing accommodating electronic components have been known.

It is beneficial to provide an electronic device with a novel structure and less inconvenience that includes a member including a lead and extending through a casing, for example.

DETAILED DESCRIPTION

In general, according to one embodiment, an electronic device includes a casing, a flexible wiring member, and a first electrical component, for example. The casing is provided with an opening. The flexible wiring member includes an insulating film, a lead mounted on the insulating film, and a connection terminal, and extends through the opening. The sealant is filled in the opening. The first electrical component is encapsulated by the casing and is electrically connected to a second electrical component outside the casing through the flexible wiring member.

Exemplary embodiments and modifications of an electronic device will be disclosed below. Configurations of embodiments (technical features) described below and actions and results (effects) produced by the configurations are merely exemplary. The configurations of embodiments described below include like or same constituent elements, and each of the embodiments can attain like or same effects on the basis of the like or same constituent elements. In the following, the like constituent elements are denoted by common reference signs, and redundant explanations thereof may be omitted. The accompanying drawings are schematic and do not depict actual dimensions.

First Embodiment

Figure 1:
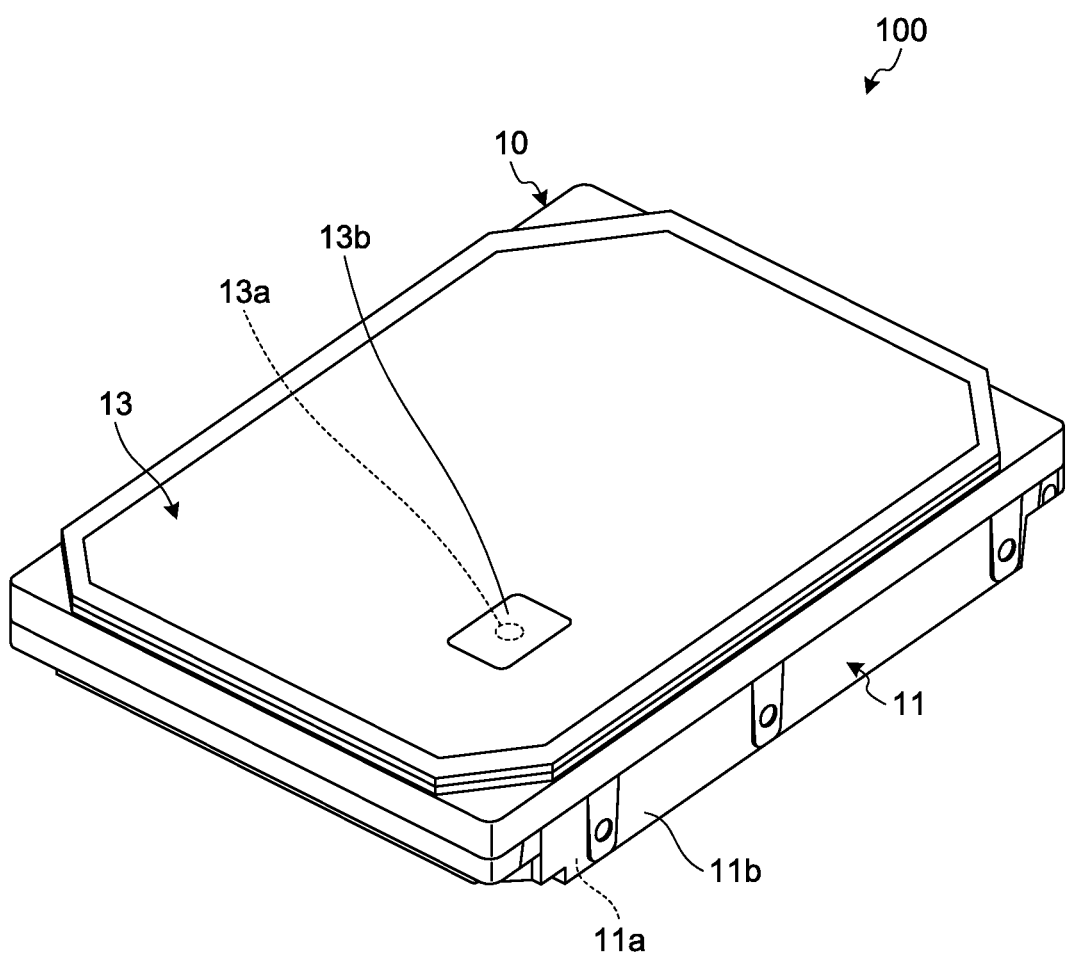
FIG. 1 is an exemplary schematic perspective diagram illustrating an electronic device according to a first embodiment.
Figure 2:
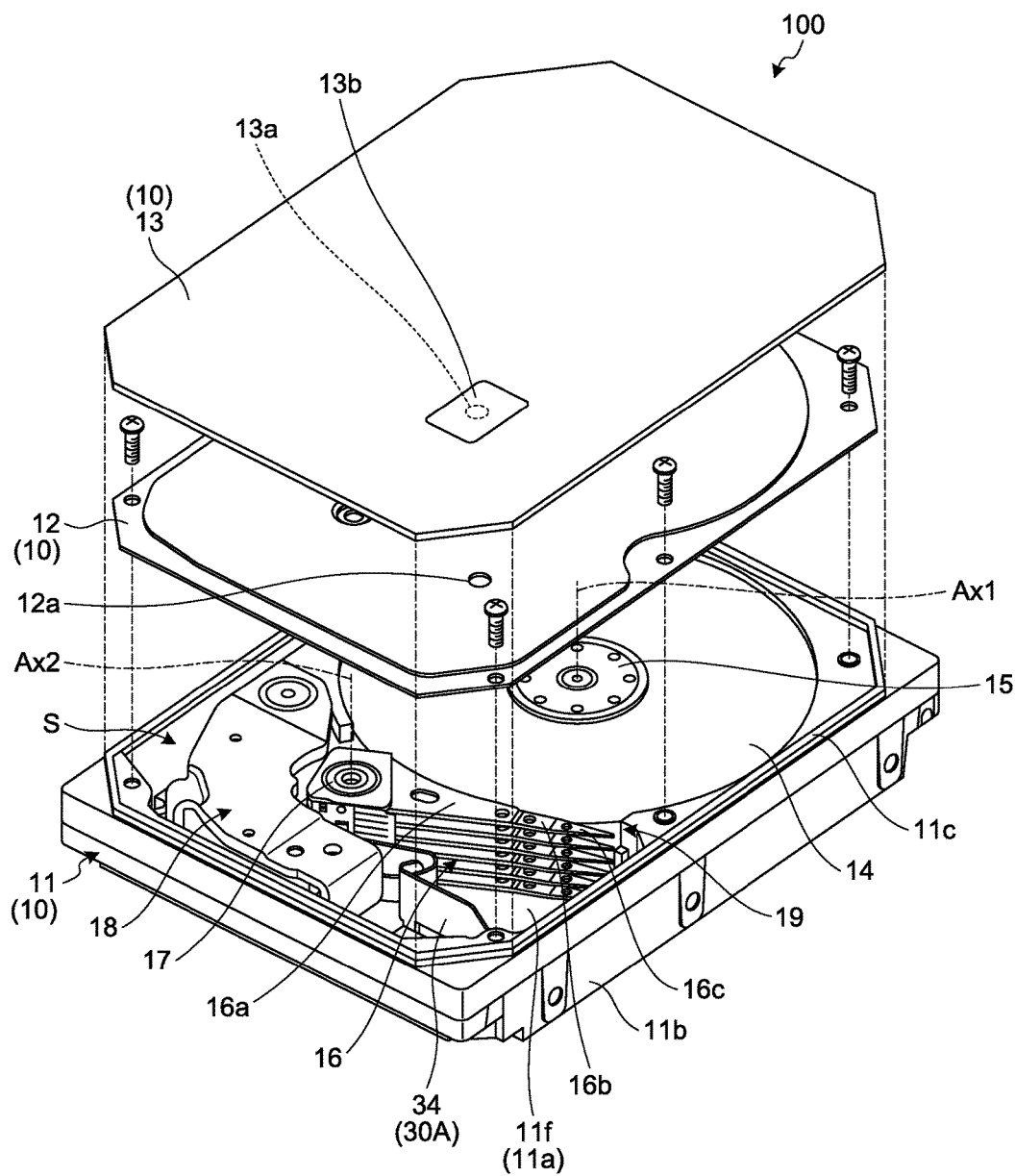
FIG. 2 is an exemplary schematic exploded perspective diagram illustrating the electronic device according to the first embodiment.

FIG. 1 is a perspective diagram illustrating an external appearance of a hard disk drive (HDD) 100. FIG. 2 is an exploded perspective diagram of the HDD 100. As illustrated in FIG. 1, the HDD 100 includes a flat cuboid casing 10. As illustrated in FIG. 2, the casing 10 includes a base 11, an inner cover 12, and an outer cover 13. The HDD 100 is an example of an electronic device.

The base 11 is a bottomed container and includes a bottom wall 11a and a peripheral wall 11b. The bottom wall 11a has a rectangular and plate-like shape. The peripheral wall 11b has a plate-like shape and protrudes from the peripheral edge of the bottom wall 11a at a substantially constant height. The bottom wall 11a and the peripheral wall 11b are integrally formed of a metal material such as an aluminum alloy.

As illustrated in FIG. 2, an internal space S of the base 11 is covered by the inner cover 12 and the outer cover 13. The inner cover 12 is fixed to a top surface of the peripheral wall 11b with coupling members such as screws. The outer cover 13, while covering the inner cover 12, is fixed to a distal end 11c of the peripheral wall 11b, for example, by means of welding. The outer cover 13 and the peripheral wall 11b are air-tightly joined together. In a first embodiment, the bottom wall 11a, the peripheral wall 11b, and the outer cover 13 are examples of an outer wall.

The inner cover 12 and the outer cover 13 are provided with air vents 12a and 13a, respectively. Components are mounted inside the base 11 first, and then the inner cover 12 and the outer cover 13 are attached to the base 11 to assemble the casing 10. Thereafter, air is removed from the casing 10 through the air vents 12a and 13a, and the casing 10 is filled with gas different from air instead. For example, the gas to fill the casing 10 is low-density gas with a lower density than air or inert gas with low reactivity, and exemplified by helium, however, it is not limited to helium. The air vent 13a of the outer cover 13 is sealed with a seal 13b to prevent the gas filling the casing 10 from leaking from the air vent 13a. In this manner, the casing 10 is sealed hermetically in the assembled HDD 100, and simultaneously is filled with gas different from air. The casing 10 may be maintained in a vacuum state or an approximate vacuum state, or may be maintained at a lower pressure than the atmospheric pressure.

As illustrated in FIG. 2, the casing 10 accommodates magnetic disks 14 and a spindle motor 15. The spindle motor 15 is supported on the bottom wall 11a to rotate the magnetic disks 14 at a predetermined rotational speed about a rotational center Ax1 crossing (perpendicular to) the bottom wall 11a. The magnetic disks 14 are attached concentrically to a hub (not illustrated) of the spindle motor 15. The number of magnetic disks 14 may be one or two or more. With the multiple magnetic disks 14 mounted as illustrated in the example in FIG. 2, the magnetic disks 14 are parallel to each other and to the bottom wall 11a.

In the casing 10 a head assembly 16 is supported rotatably on the bottom wall 11a about a rotational center Ax2 parallel to the rotational center Ax1 via a bearing 17 located radially outside the magnetic disks 14. The head assembly 16 includes arms 16a extending along the bottom wall 11a. The number of arms 16a is equal to the number of magnetic disks 14. A magnetic head 16c is attached to the distal end of each arm 16a through a suspension 16b. The magnetic heads 16c and the magnetic disks 14 are examples of a first electrical component.

The casing 10 is provided with a voice coil motor (VCM) 18 and a ramp-loading mechanism 19. The VCM 18 controls the rotation and position of the head assembly 16. The ramp load mechanism 19 holds the magnetic heads 16c at an unloaded position apart from the magnetic disks 14. The VCM 18 is an example of a first electrical component.

Figure 3:
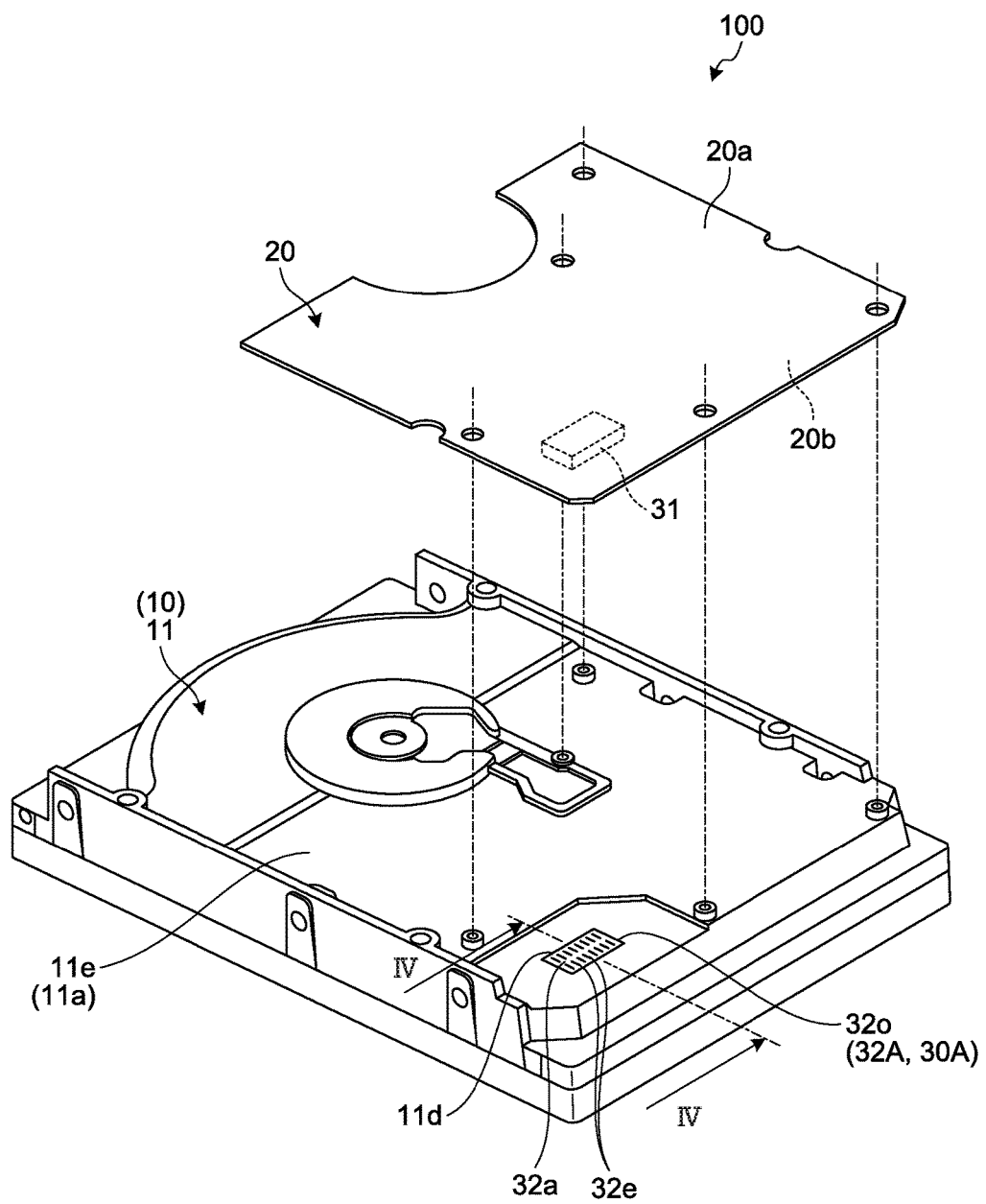
FIG. 3 is an exemplary schematic exploded perspective diagram illustrating the electronic device according to the first embodiment, as viewed oppositely to FIG. 2.

FIG. 3 is an exploded perspective diagram of the HDD 100 as viewed oppositely to FIG. 2. As illustrated in FIG. 3, a printed circuit board (PCB) 20 is mounted with a gap on an outer face 11e of the bottom wall 11a of the base 11 in parallel to the bottom wall 11a. The PCB 20 is a rigid circuit board such as a glass epoxy circuit board, a multilayered circuit board, or a build-up circuit board, but is not limited thereto. The PCB 20 includes a first face 20a and a second face 20b. The PCB 20 is fixed to the base 11 with a fixing member such as screws or with a snap-fit mechanism such as elastic hooks, with the second face 20b facing the outer face 11e and the first face 20a exposed. On the PCB 20, electrical components (not illustrated) such as an IC, a coil, a capacitor, and a resistor are mounted. These electrical components and wiring on the PCB 20 constitute a control circuit board that controls the operation and computation of the HDD 100. The PCB 20 and the electrical components mounted on the PCB 20 are examples of a second electrical component.

Control signals and data are transmitted between the PCB 20 and the magnetic heads 16c and between the PCB 20 and the VCM 18 through a wiring assembly 30A (FIGS. 2 and 3). The wiring assembly 30A includes a connector 31 and flexible printed circuit boards (FPCs) 32A and 34. The FPCs 32A and 34 are examples of the flexible wiring member.

Figure 4:
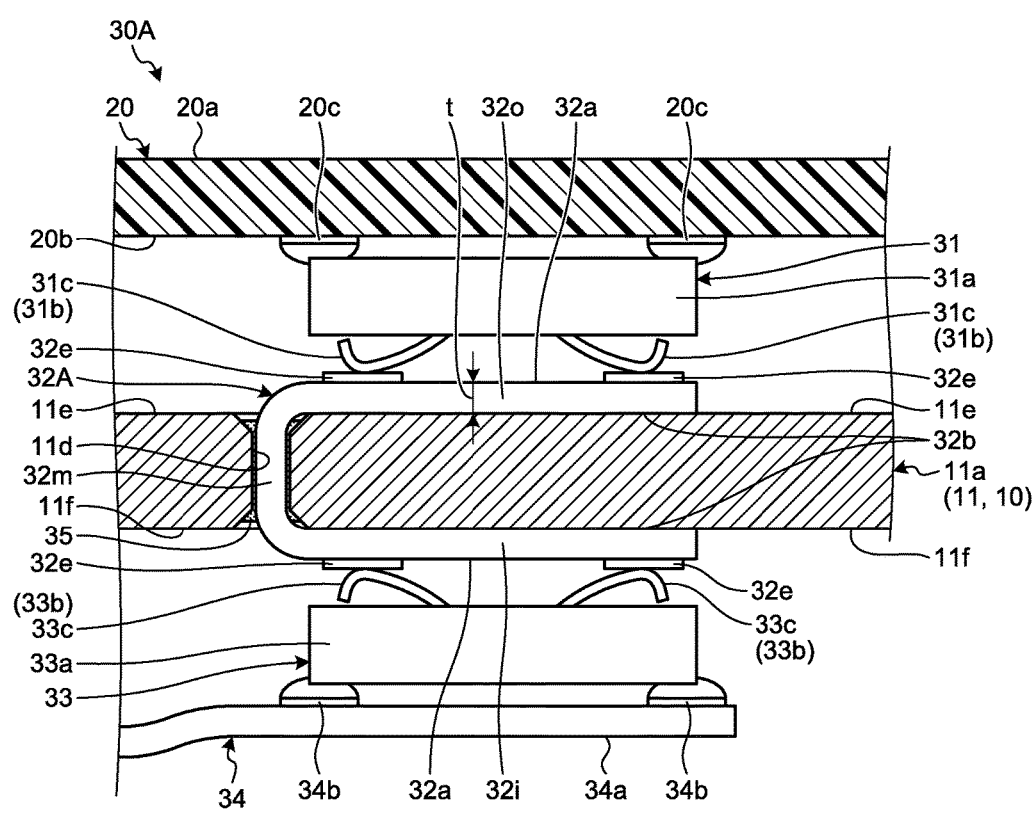
FIG. 4 is an exemplary schematic cross-sectional diagram taken along the line IV-IV in FIG. 3 illustrating a wiring assembly of the electronic device according to the first embodiment.
Figure 5:
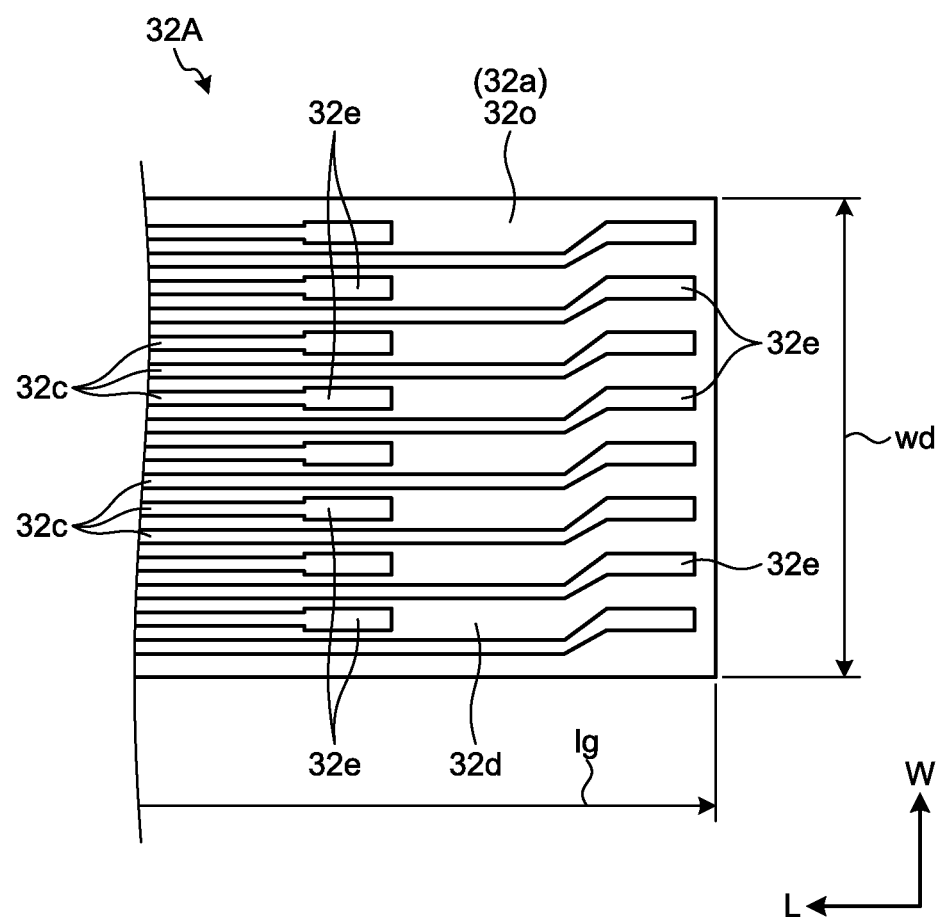
FIG. 5 is an exemplary schematic plan view illustrating an FPC included in the wiring assembly according to the first embodiment.

FIG. 4 is a cross-sectional diagram of the wiring assembly 30A taken along the line IV-IV in FIG. 3. FIG. 5 is a plan view of the FPC 32A of the wiring assembly 30A.

As illustrated in FIG. 4, the wiring assembly 30A includes the connector 31, the FPC 32A, a connector 33, and the FPC 34.

The connector 31 is fixed to the PCB 20 by soldering. The connector 31 includes an insulating base 31a and conductive terminals 31b fixed to the base 31a. One end (not illustrated) of each terminal 31b and each terminal 20c of the PCB 20 are electrically connected by soldering, and thereby, the connector 31 and the PCB 20 are mechanically connected. Further, the terminals 31b serve as elastic contacts 31c. When mounting the PCB 20 on the base 11 (the casing 10), the connector 31 and the FPC 32A are pressed against each other, causing the elastic contacts 31c to be elastically deformed. Thus, the elastically deformed contacts 31c are electrically connected to contacts 32e on a first part 32o of the FPC 32A. The configuration of the connector 31 is not limited to the one in FIG. 4. The connector 31 may be mounted on the FPC 32A. The contacts 32e are an example of a connection terminal.

The FPC 32A is in form of a thin flat strip film. The FPC 32A includes a first face 32a and a second face 32b on the opposite side (back side) of the first surface 32a.

The FPC 32A has a substantially constant thickness t (FIG. 4). A length lg and a width wd (FIG. 5) of the first face 32a and the second face 32b are greater than the thickness t. The FPC 32A includes conductor layers that constitutes leads 32c (FIG. 5), insulating layers 32d (FIG. 5), and adhesive layers (not illustrated). The conductor layers, the insulating layers 32d, and the adhesive layers are laminated on one another. The leads 32c (conductor layer) are made of a conductive metal material such as a copper-based material. The insulating layers 32d are made of an insulating synthetic resin material such as polyimide. The insulating layers 32d may each include a base layer and a cover layer. Direction of thickness refers to a direction crossing (perpendicular to) the first face 32a and the second face 32b, and may also be referred to as laminating direction. The insulating layers 32d are an example of an insulating film.

In the present embodiment, the FPC 32A is a so-called single-sided FPC, for example. That is, as illustrated in FIG. 4, the contacts 32e (terminals) of the leads 32c electrically connected to the terminals 31b of the connectors 31 are mounted on the first face 32a while no contact 32e is mounted on the second face 32b. The contacts 32e may also be referred to as exposed parts. A cover layer that covers the conductor layers on the first face 32a is not indispensable.

As illustrated in FIG. 4, the FPC 32A extends through a slit-like through hole 11d in the bottom wall 11a of the base 11. The FPC 32A includes a middle part 32m located inside the through hole 11d, the first part 32o exposed to outside the casing 10, and a second part 32i exposed to inside the casing 10. In the present embodiment, the first part 32o is positioned outside the casing 10, and the second part 32i is positioned inside the casing 10. The middle part 32m may also be referred to as passage. The through hole 11d is an example of an opening. The magnetic disks 14, the spindle motor 15, the head assembly 16, and the VCM 18 are encapsulated by the casing 10.

The FPC 32A bent into a U-shape along the thickness is fixed to the bottom wall 11a. The expression "bent along the thickness" means that the first face 32a and the second face 32b of the FPC 32A are bent. In the present embodiment, in the first part 32o, the second face 32b is fixed to the outer face 11e of the bottom wall 11a by bonding, for example. In the second part 32i, the second face 32b is fixed to an inner face 11f of the bottom wall 11a by bonding, for example. The FPC 32A may be bonded to the bottom wall 11a through an adhesive applied to the bottom wall 11a or the FPC 32A or through an adhesive sheet. The FPC 32A may also be fixed to the bottom wall 11a with a coupling member such as screws.

A clearance between the through hole 11d of the bottom wall 11a and the middle part 32m is filled with a sealant 35. The sealant 35 functions to prevent gas from leaking from the clearance between the through hole 11d and the middle part 32m and also secure the middle part 32m in the through hole 11d.

As illustrated in FIG. 5, in the first part 32o of the FPC 32A, two rows of the contacts 32e are aligned in a width direction W of the FPC 32A. The two rows are spaced apart from each other in a longitudinal direction L of the FPC 32A. Herein, the longitudinal direction L refers to a direction in which the leads 32c extend along the first face 32a. The width direction W refers to a direction along the first face 32a, crossing (perpendicular to) the longitudinal direction L. The leads 32c extend from the respective contacts 32e in the longitudinal direction L. The leads 32c are spaced apart from each other in the width direction W. The second part 32i of the FPC 32A also has the same configuration as the first part 32o illustrated in FIG. 5.

As illustrated in FIG. 4, the connector 33 is fixed to a longitudinal end 34a of the FPC 34 by soldering. The connector 33 has the same configuration as the connector 31 and thus includes an insulating base 33a and conductive terminals 33b fixed to the base 33a. One end (not illustrated) of each terminal 33b and each terminal 34b of the FPC 34 are electrically connected by soldering. Thereby, the connector 33 and the FPC 34 are mechanically connected. Further, the terminals 33b serve as elastic contacts 33c. The FPC 34 is pressed onto the bottom wall 11a by a pressing member (not illustrated) attached to the bottom wall 11a. This places the elastic contacts 33c in an elastically deformed state, and the elastically deformed contacts 33c are electrically connected to the contacts 32e on the second part 32i of the FPC 32A. The configuration of the connector 33 is not limited to the configuration in FIG. 4. The connector 33 may be mounted on the FPC 32A.

At the other end (not illustrated) of the FPC 34 in its longitudinal direction, leads (not illustrated) of the FPC 34 are electrically connected to the magnetic heads 16c and the VCM 18. The FPC 32A may also be referred to as primary wiring, while the FPC 34 may also be referred to as secondary wiring.

Due to the configuration as described above, the wiring assembly 30A electrically connects an electrical component (second electrical component) outside the casing 10 such as the PCB 20 to an electrical component (first electrical component) inside the casing 10 such as the magnetic heads 16c and the VCM 18 through the connector 31, the FPC 32A, the connector 33, and the FPC 34.

As described above, in the present embodiment, the magnetic heads 16c and the VCM 18 (first electrical component) are electrically connected to the PCB 20 (second electrical component) through the thin flat FPC 32A (flexible wiring member). By such configuration, the cross-sectional area of the passage (the through hole 11d) from the inside of the casing 10 to outside can be reduced, for example. The inventors have found through their earnest studies that the smaller the cross-sectional area of a synthetic resin material extending through the passage is, the lower the gas permeability in the passage is. In this regard, according to the present embodiment, the thin-film wiring member, i.e., the FPC 32A extends through the passage (the through hole 11d) of the casing 10, thereby lowering gas permeability in the passage and leading to maintaining the airtightness of the casing 10.

The FPC 32A (flexible wiring member) is more flexible than a rigid circuit board. In addition, the FPC 32A is thinner than a rigid circuit board. The FPC 32A is thus less likely to interfere with other components even if the FPC 32A occupies a longer section of the casing 10. Because of this, according to the present embodiment, by partially bending the FPC 32A along the thickness or bending it along the first face 32a (the second face 32b), the layout flexibility of the HDD 100 can be improved, for example, in terms of the position of a passage where the FPC 32A extends through the casing 10, and the position of electrical connection between the FPC 32A and its adjacent electrical components such as the connectors 31 and 33. That is, bending the FPC 32A makes it possible to dispose the contacts 32e at any distant position from the through hole 11d (opening). Thus, efficient component arrangement in the HDD 100 is feasible, for example, which may result in achieving a more compact-size HDD 100 and a reduction in manufacturing time and costs for the HDD 100. Further, the inclusion of the FPC 32A leads to increasing a tolerance for misalignment between the two components between which the FPC 32A is interposed, for example, which may also result in attaining reduction in manufacturing time and costs for the HDD 100.

In the present embodiment, the first part 32o of the FPC 32A is fixed to the outer face 11e of the bottom wall 11a (partition wall) of the casing 10, while the second part 32i of the FPC 32A is fixed to the inner face 11f of the bottom wall 11a. With the FPC 32A fixed to at least one of the outer face 11e and the inner face 11f of the bottom wall 11a, for example, the electrical connection between the FPC 32A and the adjacent electrical components including the connectors 31 and 33 can be ensured. Due to the fixation of the FPC 32A to at least one of the outer face 11e and the inner face 11f of the bottom wall 11a, the FPC 32A can be inhibited from being displaced in the through hole 11d, for example. In the present embodiment, for example, the FPC 32A and the neighboring electrical components are interposed between the bottom wall 11a and the members (for example, the PCB 20 and the pressing member) mounted on the bottom wall 11a, utilizing the bottom wall 11a as a back plate of the FPC 32A. This further facilitates ensuring the electrical connection between the FPC 32A and the neighboring electrical components. In the present embodiment, the FPC 32A is fixed to both the outer face 11e and the inner face 11f of the bottom wall 11. That is, the FPC 32A can be more firmly fixed to the bottom wall 11a, for example.

In the present embodiment, for example, the smaller-size, lighter-weight FPC 32A contributes to downsizing and weight reduction of the HDD 100.

In the present embodiment, a partition wall to which the FPC 32A is fixed is the bottom wall 11a of the base 11 of the casing 10. This can simplify the configuration of the HDD 100.

The flat flexible wiring member is not limited to the FPCs 32A and 34, and may be a flexible flat cable (FFC).

Second Embodiment

Figure 6:
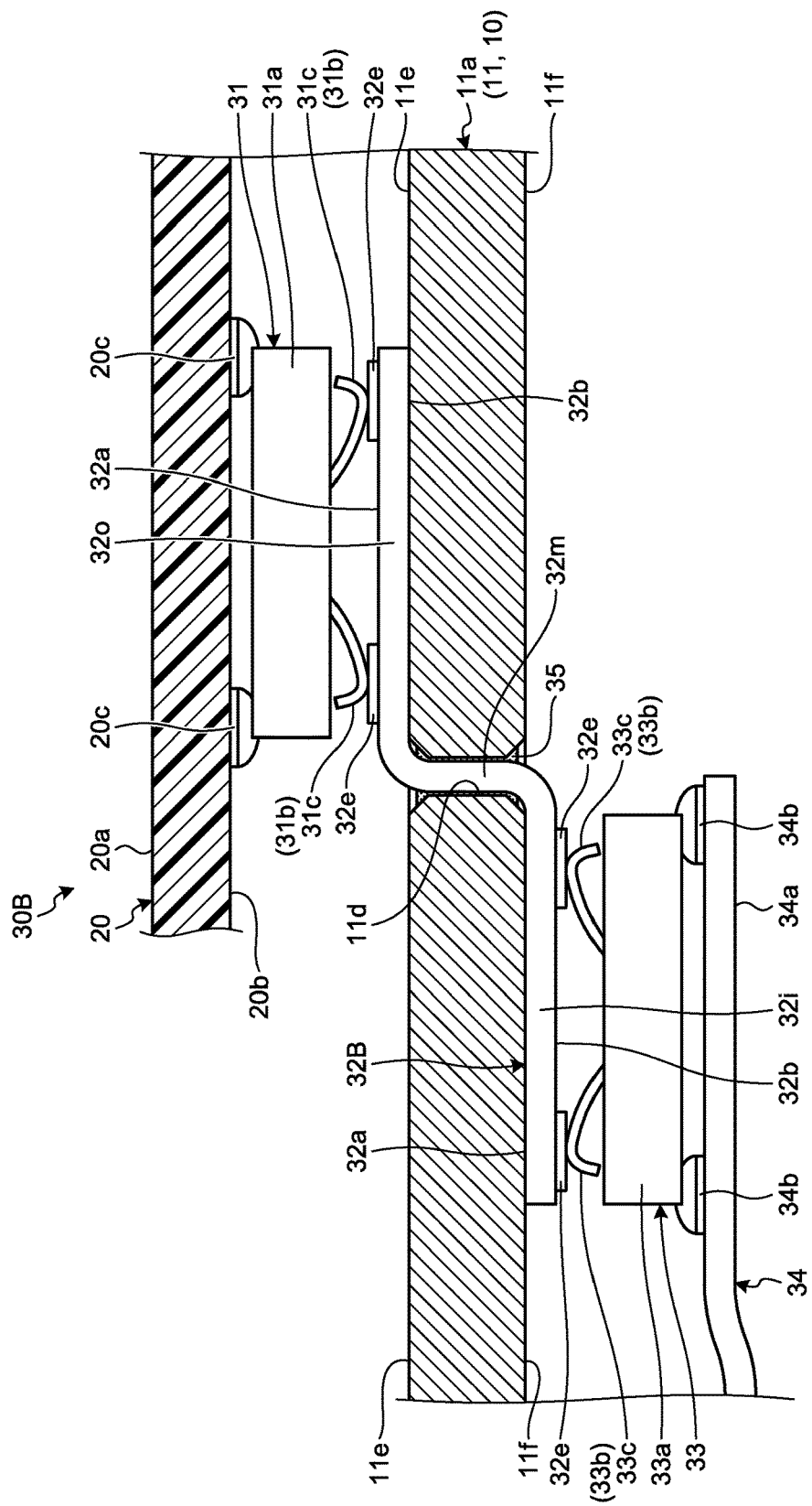
FIG. 6 is an exemplary schematic cross-sectional diagram illustrating a wiring assembly included in an electronic device according to a second embodiment.

FIG. 6 is a cross-sectional diagram of a wiring assembly 30B according to a second embodiment. The HDD 100 can include the wiring assembly 30B in place of the wiring assembly 30A. The present embodiment is different from the first embodiment in that the wiring assembly 30B includes an FPC 32B bent into an S-shape, and in that the first part 32o and the second part 32i of the FPC 32B are distanced from each other along the bottom wall 11a. In the FPC 32B, the contacts 32e electrically connected to the terminals 31b of the connector 31 are provided on the first face 32a, and the contacts 32e electrically connected to the terminals 33b of the connector 33 are provided on the second face 32b. That is, the FPC 32B is a so-called double-sided FPC.

According to the present embodiment, the layout flexibility of the first part 32o (and the connector 31) and the second part 32i (and the connector 33) can be improved, which may result in attaining a more compact HDD 100, and reduction in manufacturing time and costs for the HDD 100, for example. The specifications of the wiring assembly 30B can be changed in various ways. For example, the position of the contacts 32e and the position of the connectors 31 and 33 are not limited to those illustrated in FIG. 6. The distances from the middle part 32m of the FPC 32B to the connectors 31 and 33 may be different from each other, or the connectors 31 and 33 may be misaligned from each other vertically relative to the drawing of FIG. 6.

Third Embodiment

Figure 7:
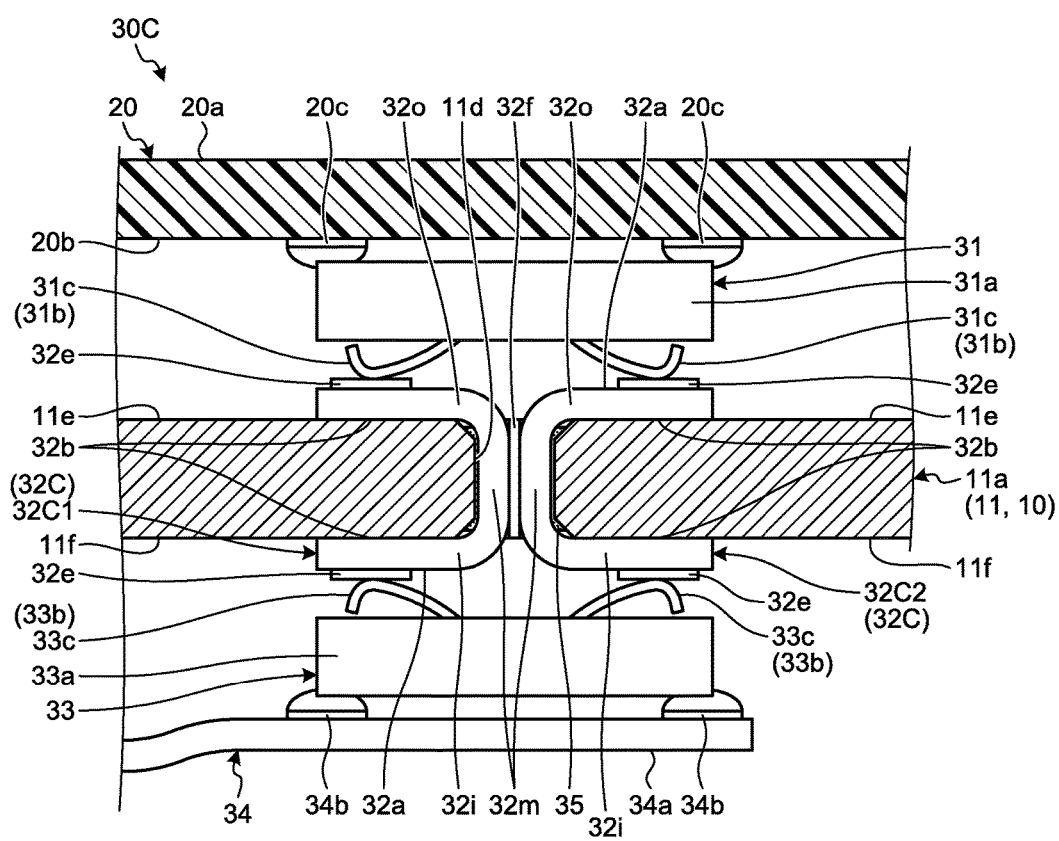
FIG. 7 is an exemplary schematic cross-sectional diagram illustrating a wiring assembly of an electronic device according to a third embodiment.
Figure 8:
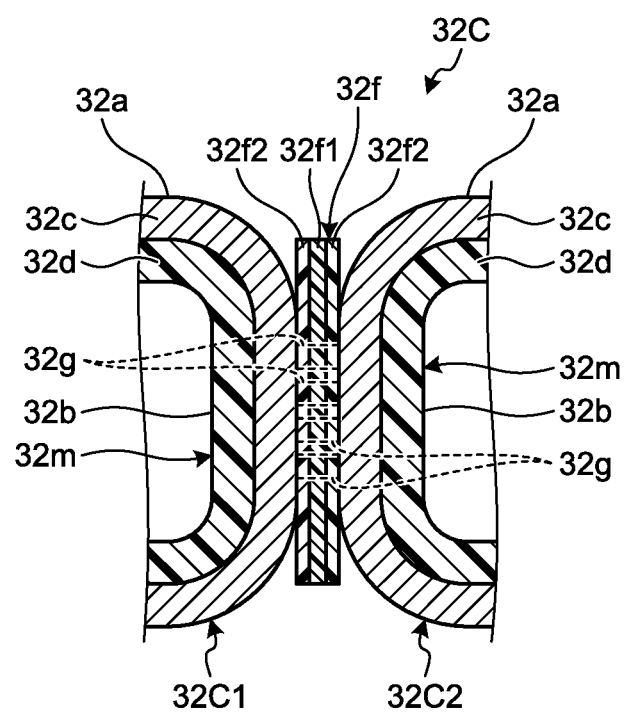
FIG. 8 is an exemplary schematic enlarged diagram illustrating a part of a cross section of an FPC of the wiring assembly according to the third embodiment.
Figure 9:
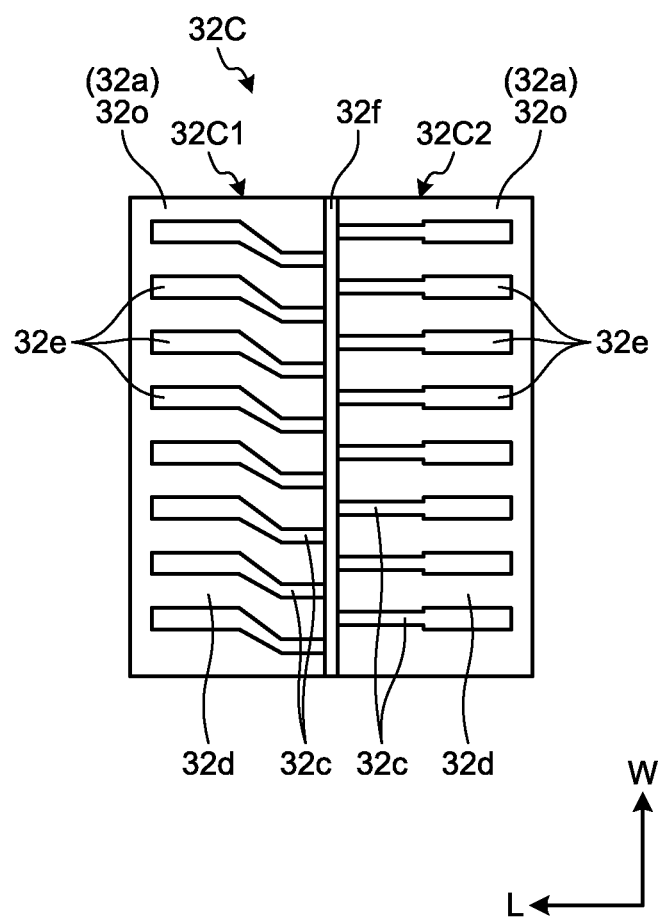
FIG. 9 is an exemplary schematic plan view illustrating the FPC of the wiring assembly according to the third embodiment.

FIG. 7 is a cross-sectional diagram of a wiring assembly 30C according to a third embodiment. FIG. 8 is a partially enlarged diagram of an FPC 32C of the wiring assembly 30C. FIG. 9 is a plan view of the FPC 32C. The HDD 100 can include the wiring assembly 30C in place of the wiring assembly 30A. The present embodiment is different from the above embodiments in that the FPC 32C of the wiring assembly 30C is formed by coupling an FPC 32C1 and an FPC 32C2 to each other. The FPC 32C may also be referred to as a coupled FPC or integrated FPC. As illustrated in FIG. 7, each of the FPCs 32C1 and 32C2 is, for example, a so-called single-sided FPC, has the same configuration as the FPC 32A in the first embodiment, and is attached to the bottom wall 11a of the casing 10, extending through the through hole 11d in the bottom wall 11a, as with the FPC 32A. The FPC 32C is an example of a flexible wiring member. The FPC 32C1 is an example of a first flexible wiring member. The FPC 32C2 is an example of a second flexible wiring member.

However, as illustrated in FIGS. 7 and 8, the U-shaped FPC 32C1 and FPC 32C2 are integrated through a connection 32f with their respective U-shapes reversed to each other. The connection 32f is interposed between a middle part 32m of the FPC 32C1 and a middle part 32m of the FPC 32C2 to integrate the two middle parts 32m. The connection 32f is an example of a joint. The first part 32o of the FPC 32C1 and the first part 32o of the FPC 32C2 extend from the connection 32f in a direction away from each other. The second part 32i of the FPC 32C1 and the second part 32i of the FPC 32C2 extend from the connection 32f in a direction away from each other. The two middle parts 32m and the connection 32f extend through the through hole 11d of the bottom wall 11a. The connection 32f includes a core layer 32f1 at the center, and two bonding layers 32f2 (adhesive layers) placing the core layer 32f1 in-between. The bonding layers 32f2 bond the core layer 32f1 to the FPC 32C1 and to the FPC 32C2. The core layer 32f1 and the bonding layers 32f2 all have insulating properties. The core layer 32f1 is made of a synthetic resin material such as polyimide. As illustrated in FIG. 8, the lead 32c (conductor layer) of the FPC 32C1 and the lead 32c (conductor layer) of the FPC 32C2 may be electrically connected through a conductor such as vias 32g extending through the connection 32f.

The connectors 31 and 33 are disposed across the FPCs 32C1 and 32C2. The connector 31 includes the terminals 31b electrically connected to the contacts 32e of the FPC 32C1, and the terminals 31b electrically connected to the contacts 32e of the FPC 32C2. The connector 33 includes the terminals 33b electrically connected to the contacts 32e of the FPC 32C1, and the terminals 33b electrically connected to the contacts 32e of the FPC 32C2.

As understood from FIGS. 7 and 9, according to the present embodiment, the middle parts 32m and the connection 32f can be placed between two rows of the contacts 32e aligned in the width direction W of the FPC 32C. This can reduce the installation area of the FPC 32C in the bottom wall 11a (outer wall). Thus, the wiring assembly 30C according to the present embodiment can be made more compact in size, therefore, be more effective when a greater number of leads 32c (the contacts 32e and the terminals 31b and 34b) is set.

Fourth Embodiment

Figure 10:
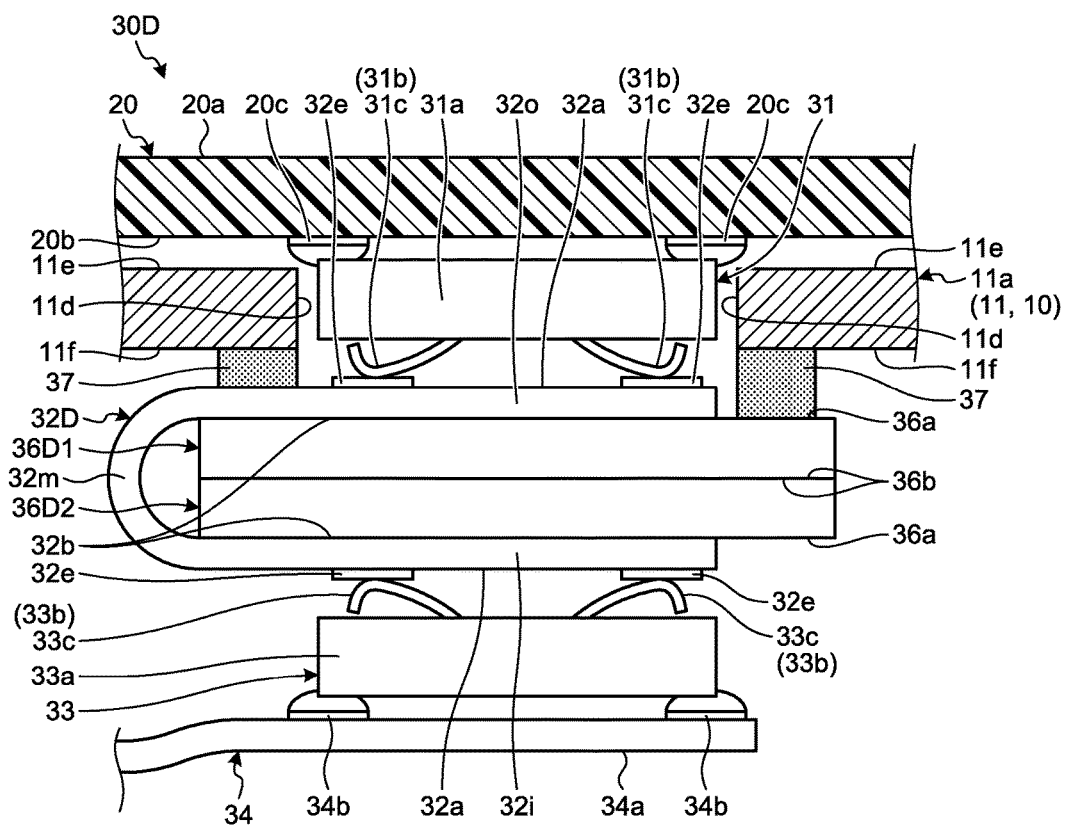
FIG. 10 is an exemplary schematic cross-sectional diagram illustrating a wiring assembly of an electronic device according to a fourth embodiment.

FIG. 10 is a cross-sectional diagram of a wiring assembly 30D according to a fourth embodiment. The HDD 100 can include the wiring assembly 30D in place of the wiring assembly 30A. The present embodiment is different from the above embodiments in that an FPC 32D of the wiring assembly 30D includes reinforcement plates 36D1 and 36D2, and in that a subassembly including the FPC 32D and the reinforcement plates 36D1 and 36D2 covers the through hole 11d in the bottom wall 11a of the casing 10 from inside the casing 10. In the present embodiment, the first part 32o, the second part 32i exposed to the inside of the casing 10, and the middle part 32m are all positioned in the casing 10. The subassembly including the FPC 32D and the reinforcement plates 36D1 and 36D2 is attached to the bottom wall 11a with a fixing member (not illustrated) such as screws.

The reinforcement plates 36D1 and 36D2 are made of a metal material such as an aluminum alloy or a ferrous alloy. However, the materials of the reinforcement plates 36D1 and 36D2 are not limited thereto. The reinforcement plates 36D1 and 36D2 are, for example, rectangular plate members with a constant thickness greater than the FPC 32D. Each of the reinforcement plates 36D1 and 36D2 includes a first face 36a joined to the FPC 32D and a second face 36b on the opposite side. The reinforcement plates 36D1 and 36D2 may have a same shape. The first face 36a is an example of an outer face. The second face 36b is an example of an inner face. In the present embodiment, the subassembly including the FPC 32D and the reinforcement plates 36D1 and 36D2 can be considered as part of the casing 10 (the bottom wall 11a).

For example, the FPC 32D is a so-called single-sided FPC and has the same configuration as the FPC 32A according to the first embodiment. However, in the present embodiment, the first part 32o of the FPC 32D is fixed to the first face 36a of the reinforcement plate 36D1 by bonding. The second part 32i of the FPC 32D is fixed to the first face 36a of the reinforcement plate 36D2 by bonding. The middle part 32m between the first part 32o and the second part 32i of the FPC 32D is bent into a U-shape. The reinforcement plates 36D1 and 36D2 are placed on top of each other in the thickness direction, with the second face 36b of the reinforcement plate 36D1 and the second face 36b of the reinforcement plate 36D2 facing each other. That is, the U-shaped FPC 32D holds not the bottom wall 11a but the two reinforcement plates 36D1 and 36D2 put on top of each other in the thickness direction between the first section 32o and the second section 32i. In the present embodiment, the two reinforcement plates 36D1 and 36D2 placed on top of each other are examples of a partition wall. The thickness direction of the reinforcement plates 36D1 and 36D2 refers to a direction crossing (perpendicular to) the first face 36a and the second face 36b. Of the two reinforcement plates 36D1 and 36D2, the first face 36a of the reinforcement plate 36D1 located outside the casing 10 is an example of an outer face, and the first face 36a of the reinforcement plate 36D2 located inside the casing 10 is an example of an inner face. The first part 32o is an example of a first fixed part. The second part 32i is an example of a second fixed part. The two reinforcement plates 36D1 and 36D2 may be integrated as a subassembly by bonding, for instance, or closely placed on top of each other when attaching the subassembly to the casing 10 with a fixing member such as screws. The two reinforcement plates 36D1 and 36D2 may not be bonded, and an insulating layer, an adhesive layer, or a cushion layer may be inserted between the two reinforcement plates 36D1 and 36D2, for example. The configuration of the subassembly including an FPC and reinforcement plates is not limited to the example in FIG. 10. For example, the subassembly may be the U-shaped FPC 32D that holds a single reinforcement plate between the first part 32o and the second part 32i in the thickness direction between the first section 32o and the second section 32i.

A gap between the FPC 32D (subassembly) and the bottom wall 11a of the casing 10 is sealed with a sealant 37. The sealant 37 is endlessly applied along the peripheral edge of the through hole 11d in the bottom wall 11a to seal the gap between the inner face 11f of the bottom wall 11a and the first face 32a of the FPC 32D or the first face 36a of the reinforcement plate 36D1 at the peripheral edge of the through hole 11d.

As described above, in the present embodiment, the reinforcement plates 36D1 and 36D2 (partition walls) to which the FPC 32D is fixed are attached to cover the through hole 11d (opening) in the bottom wall 11a (outer wall) from the inside of the casing 10. Thus, according to the present embodiment, for example, the reinforcement plates 36D1 and 36D2 can inhibit distortion of the FPC 32D caused by a difference in pressure between inside and outside the casing 10 or by an external force, and can help firmly secure the FPC 32D onto the casing 10.

In the present embodiment, as illustrated in FIG. 10, the FPC 32D passes between the bottom wall 11a and the reinforcement plate 36D1. Thus, according to the present embodiment, for example, the bottom wall 11a does not need to be provided with a relatively small, narrow, slit-type through hole. Further, as illustrated in FIG. 10, in the present embodiment, the connector 31 is accommodated in the through hole 11d of the bottom wall 11a. Thus, according to the present embodiment, for example, as compared with the connector 31 placed on the outer face 11e or the inner face 11f of the bottom wall 11a, the HDD 100 can be made more compact in size in the thickness direction of the bottom wall 11a, that is, in the direction crossing (perpendicular to) the outer face 11e and the inner face 11f of the bottom wall 11a.

Fifth Embodiment

Figure 11:
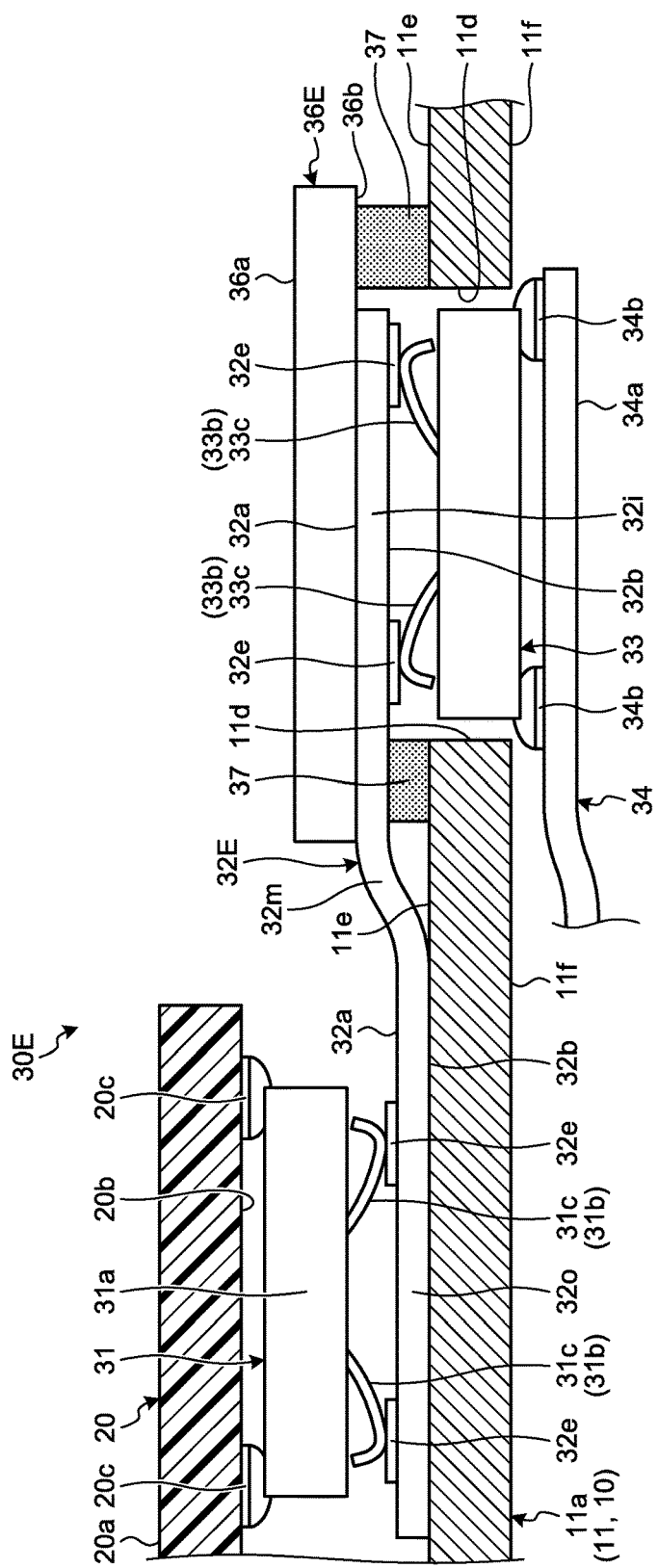
FIG. 11 is an exemplary schematic cross-sectional diagram illustrating a wiring assembly of an electronic device according to a fifth embodiment.

FIG. 11 is a cross-sectional diagram of a wiring assembly 30E according to a fifth embodiment. The HDD 100 can include the wiring assembly 30E in place of the wiring assembly 30A. The present embodiment is different from the above embodiments in that the second part 32i of an FPC 32E of the wiring assembly 30E is provided with a reinforcement plate 36E but the first part 32o is provided with no reinforcement plate, in that, of a subassembly including the FPC 32E and the reinforcement plate 36E, the second part 32i and the reinforcement plate 36E cover the through hole 11d in the bottom wall 11a of the casing 10 from outside the casing 10, and in that the first part 32o and the second part 32i are distanced from each other along the bottom wall 11a. In the present embodiment, the first part 32o facing (exposed) outside of the casing 10, the second part 32i exposed to the inside of the casing 10, and the middle part 32m are all positioned outside the outer face 11e of the casing 10. The subassembly including the FPC 32E and the reinforcement plate 36E is attached to the bottom wall 11a with a fixing member (not illustrated) such as screws. In the present embodiment, the reinforcement plate 36E can be regarded as part of the casing 10 (the bottom wall 11a).

In the FPC 32E, the contacts 32e electrically connected to the terminals 31b of the connector 31 are provided on the first face 32a while the contacts 32e electrically connected to the terminals 33b of the connector 33 are provided on the second face 32b. That is, the FPC 32E is a so-called double-sided FPC.

According to the present embodiment, the layout flexibility of the first part 32o (and the connector 31) and the second part 32i (and the connector 33) can be improved. This may result in attaining a more compact HDD 100 in size and reduction in manufacturing time and costs for the HDD 100, for example. The specifications of the wiring assembly 30E can be changed in various ways. For example, the positions of the contacts 32e and the connectors 31 and 33 are not limited to those illustrated in FIG. 11. The distances to the connectors 31 and 33 from the middle part 32m of the FPC 32E may be different from each other. The connectors 31 and 33 may be misaligned from each other vertically relative to the drawing of FIG. 11.

Sixth Embodiment

Figure 12:
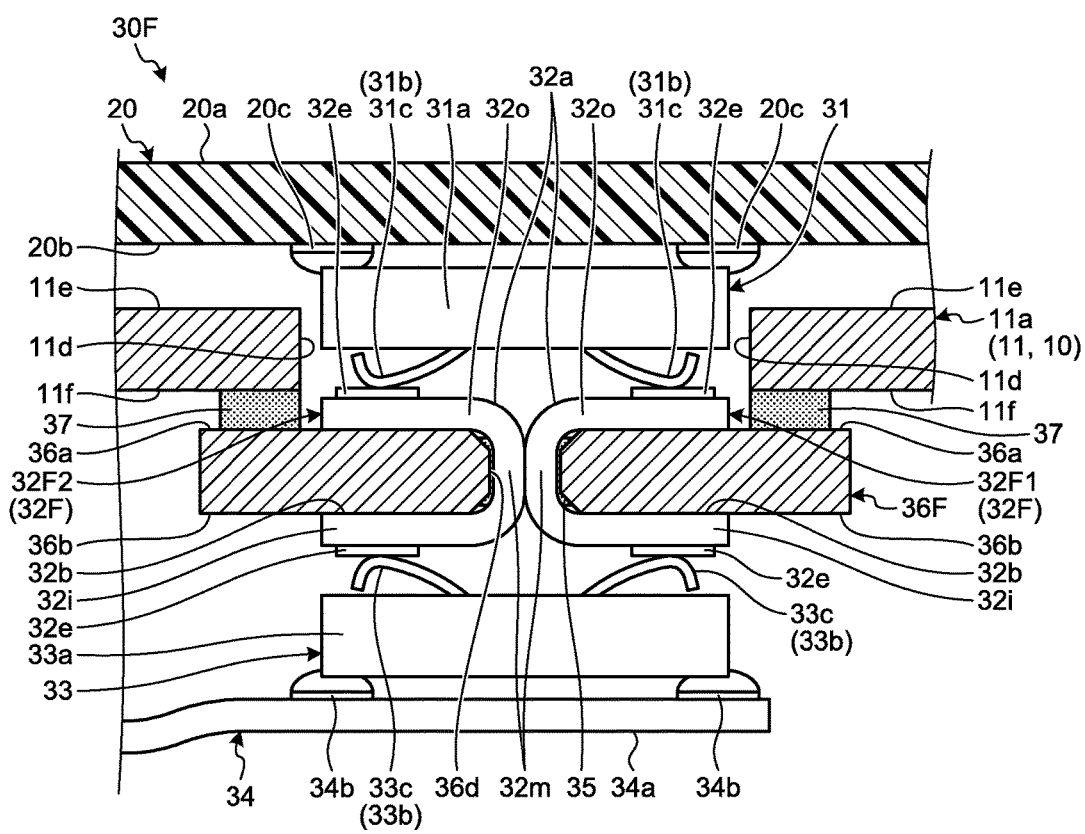
FIG. 12 is an exemplary schematic cross-sectional diagram illustrating a wiring assembly of an electronic device according to a sixth embodiment.

FIG. 12 is a cross-sectional diagram of a wiring assembly 30F according to a sixth embodiment. The HDD 100 can include the wiring assembly 30F in place of the wiring assembly 30A. In the present embodiment, the wiring assembly 30F includes an FPC 32F which is formed by coupling an FPC 32F1 and an FPC 32F2 as in the third embodiment illustrated in FIG. 7. The FPC 32F is, for example, a so-called single-sided FPC, as with the first and third embodiments. The FPC 32F is an example of a flexible wiring member. The FPC 32F1 is an example of a first flexible wiring member. The FPC 32F2 is an example of a second flexible wiring member.

In the present embodiment, a subassembly including the FPC 32F and a reinforcement plate 36F covers the through hole 11d in the bottom wall 11a of the casing 10 from inside the casing 10 in the same manner as in the fourth embodiment illustrated in FIG. 10. In the present embodiment, the reinforcement plate 36F can be regarded as part of the casing 10 (the bottom wall 11a).

However, the present embodiment is different from the fourth embodiment in that the U-shaped FPCs 32F1 and 32F2 each hold not the bottom wall 11a but a single reinforcement plate 36F by extending through a through hole 36d in the reinforcement plate 36F. The present embodiment can attain similar effects to those of the third embodiment and the fourth embodiment.

Seventh Embodiment

Figure 13:
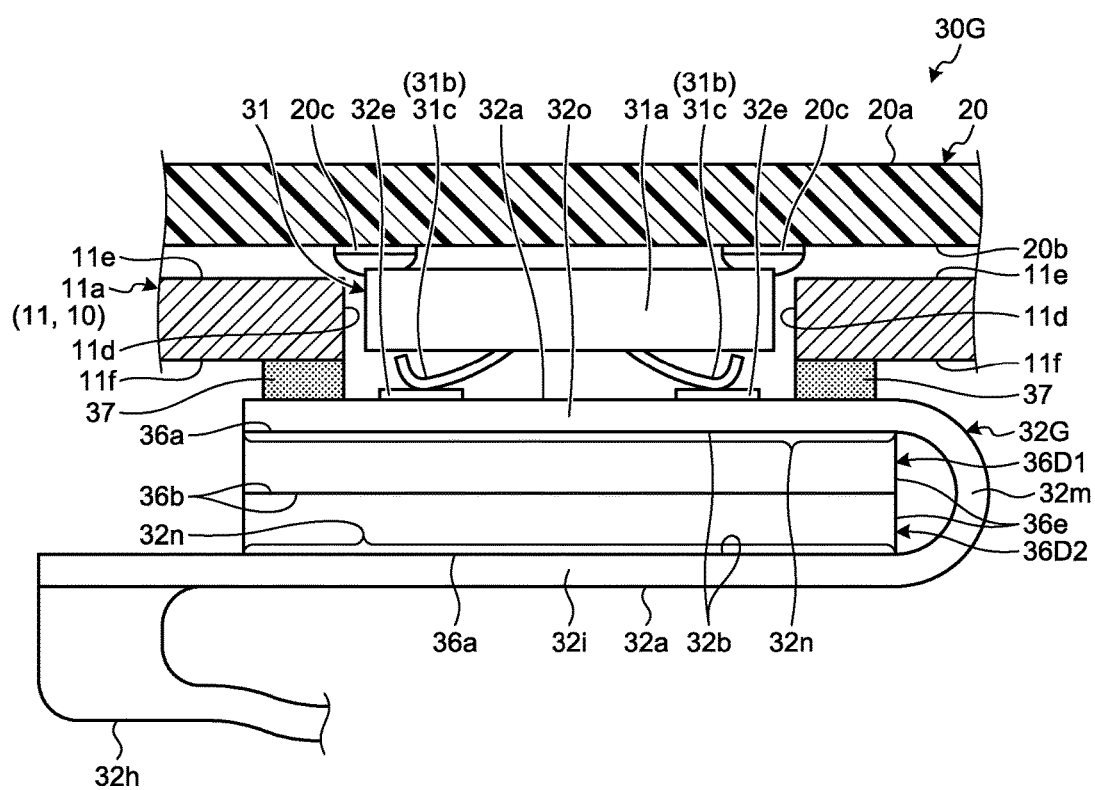
FIG. 13 is an exemplary schematic cross-sectional diagram illustrating a wiring assembly of an electronic device according to a seventh embodiment.
Figure 14:
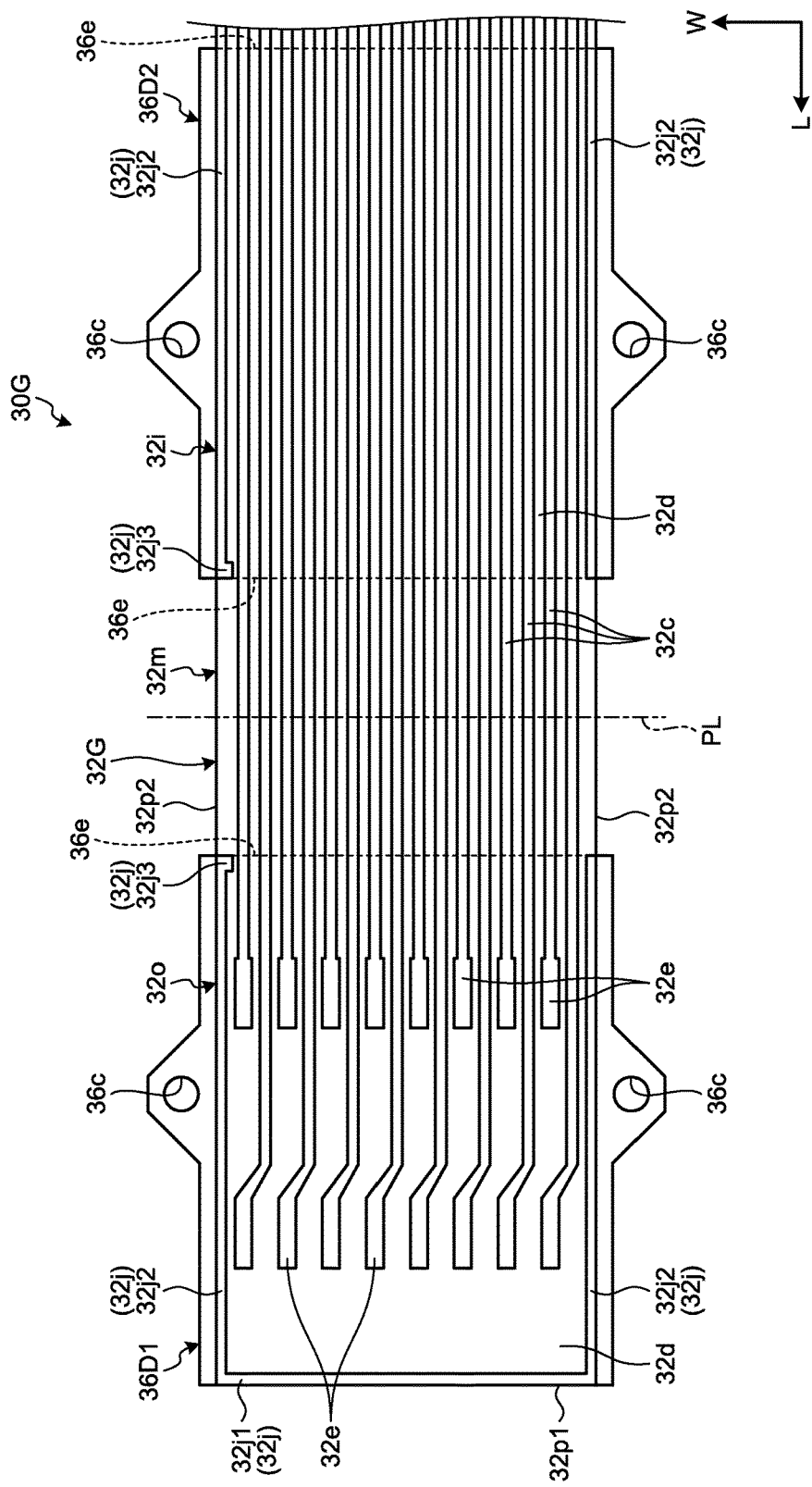
FIG. 14 is an exemplary schematic development diagram illustrating a subassembly including an FPC of the wiring assembly and reinforcement plates according to the seventh embodiment.

FIG. 13 is a cross-sectional diagram of a wiring assembly 30G according to a seventh embodiment. FIG. 14 is a development diagram of a subassembly of the wiring assembly 30G including an FPC 32G and the reinforcement plates 36D1 and 32D2. The HDD 100 can include the wiring assembly 30G in place of the wiring assembly 30A. In the present embodiment, the subassembly including the FPC 32G and the reinforcement plates 36D1 and 36D2 covers the through hole 11d in the bottom wall 11a of the casing 10 from inside the casing 10, as in the fourth embodiment illustrated in FIG. 10. In the present embodiment, the FPC 32G is also bonded to the reinforcement plates 36D1 and 36D2.

However, in the present embodiment, the wiring assembly 30G does not include the FPC 34 of the above embodiments, and the FPC 32G includes a third part 32h as an alternative to the FPC 34. The third part 32h extends from the second part 32i oppositely to the first part 32o. The third part 32h is connected to electrical components (first electrical component) in the casing 10 such as the magnetic heads 16c and the VCM 18 at a distant position (not illustrated) from the second part 32i opposite the first part 32o. The electrical components in the casing 10 such as the magnetic heads 16c and the VCM 18 are electrically connected to the PCB 20 and electrical components (second electrical component) mounted on the PCB 20 through the leads 32c of the FPC 32G. That is, the wiring assembly 30G in the present embodiment is regarded as being equivalent to the integrated FPC 32D and FPC 34 without the connector 33 in the fourth embodiment illustrated in FIG. 10.

According to the present embodiment, for example, the number of parts or components can be reduced, which can reduce manufacturing time and costs for the wiring assembly 30G. In the present embodiment, in the FPC 32G, the second part 32i, located between the first part 32o and the end of the FPC 32G connected to the electrical components in the casing 10 such as the magnetic heads 16c and the VCM 18, is joined to the reinforcement plate 36D2 (partition wall). Thus, an elastic repulsive force from a distortion or motion of the third part 32h acts mainly on the second part 32i, which reduces the repulsive force acting on the first part 32o. Thus, according to the present embodiment, for example, degradation of the sealability of the sealant 37 can be inhibited by allowing the elastic repulsive force from the distortion or motion of the third part 32h to act onto the first part 32o.

As illustrated in FIG. 14, the FPC 32G includes a conductor layer 32j (32j1, 32j2, and 32j3) in addition to the leads 32c through which data and control signals are transmitted.

For example, the conductor layer 32j and the leads 32c are both laminated on the insulating layer 32d in the same process. In other words, the leads 32c and the conductor layer 32j are at the same position in the thickness direction of the FPC 32G. However, the conductor layer 32j and the leads 32c may be provided on different layers. The conductor layer 32j may also be electrically connected to a ground conductor (not illustrated), for example.

In the present embodiment, within the first part 32o and the second part 32i of the FPC 32G, regions that overlap with the reinforcement plates 36D1 and 36D2 (bonded regions 32n in FIG. 13) are bonded in their entirety to the reinforcement plates 36D1 and 36D2. The conductor layer 32j is placed to overlap with the ends of the bonded regions 32n of the FPC 32G. That is, as illustrated in FIG. 14, the conductor layer 32j includes conductor layers 32j1, 32j2, and 32j3. The conductor layers 32j1 and 32j2 are provided respectively at ends 32p1 and 32p2 (peripheral edge) of the first part 32o or the second part 32i. The conductor layer 32j3 is placed to overlap with ends 36e (peripheral edge) of the reinforcement plates 36D1 and 36D2 in the first part 32o or the second part 32i. The conductor layer 32j1 extends in the width direction W at the end 32p1 of the FPC 32G in its longitudinal direction L. The conductor layer 32j2 extends in the longitudinal direction L at the end 32p2 of the FPC 32G in its width direction W. In the first part 32o or the second part 32i, the conductor layer 32j3 is located to overlap with, in the thickness direction of the FPC 32G, the ends 36e of the reinforcement plates 36D1 and 36D2 adjacent to the middle part 32m. In other words, the ends 36e are part of the peripheral edges of the reinforcement plates 36D1 and 36D2 and covered by the FPC 32G. A peripheral edge of the FPC 32G is an end of the first face 32a or the second face 32b, in other words, an end of the FPC 32G in a direction crossing (perpendicular to) the first face 32a or the second face 32b, that is, in the thickness direction of the FPC 32G. The peripheral edges of the reinforcement plates 36D1 and 36D2 are an end of the first face 36a or the second face, in other words, ends of the reinforcement plates 36D1 and 36D2 in a direction crossing (a direction perpendicular to) the first face 36a or the second face 36b, that is, in the thickness direction of the reinforcement plates 36D1 and 36D2. The thickness direction of the reinforcement plates 36D1 and 36D2 refers to a direction crossing (perpendicular to) the first face 36a and the second face 36b. The thickness direction of the FPC 32G is the same as the thickness direction of the reinforcement plates 36D1 and 36D2. That is, the FPC 32G and the reinforcement plates 36D1 and 36D2 overlap one another in the thickness direction of the FPC 32G and the thickness direction of the reinforcement plates 36D1 and 36D2.

The conductor layer 32j is provided away from the middle part 32m being a bent part of the FPC 32G in the thickness direction. The middle part 32m is an example of a bent part in a thickness direction. The bent part of the FPC 32G in the thickness direction means that the first face 32a and the second face 32b are bent into a convex or concave form.

As described above, according to the present embodiment, the reinforcement plates 36D1 and 36D2 (partition walls) are bonded to the FPC 32G. The FPC 32G includes the conductor layer 32j located so as to overlap with the ends of the bonded regions 32n of the reinforcement plates 36D1 and 36D2. The conductor layer 32j can prevent liquid including water from penetrating the FPC 32G in the thickness direction and degrading an adhesive on the bonded regions. When a force acts on either the FPC 32G or the reinforcement plates 36D1 and 36D2 bonded via the bonded regions 32n of the FPC 32G in such a manner as to remove these elements from the bonded regions 32n, the peripheral edge (end) of the bonded regions 32n is a likely starting point of the removal. In this regard, in the present embodiment, the FPC 32G includes the conductor layer 32j, which can inhibit penetration of liquid into the FPC 32G in the thickness direction, at the overlapping positions with the ends of the bonded regions 32n. Thus, according to the present embodiment, for example, the FPC 32G and the reinforcement plates 36D1 and 36D2 are prevented from being detached from each other from the ends of the bonded regions 32n. The specifications such as the size and length of the conductor layer 32j are not limited to those illustrated in FIGS. 13 and 14, and various modifications can be made.

If the conductor layer 32j is provided on the middle part 32m of the FPC 32G, it may be difficult to bend the middle part 32m in the thickness direction. In this regard, in the present embodiment, the conductor layer 32j is provided away from the middle part 32m of the FPC 32G, so that the conductor layer 32j does not interfere with the bending of the FPC 32G in the thickness direction.

Eighth Embodiment

Figure 15:
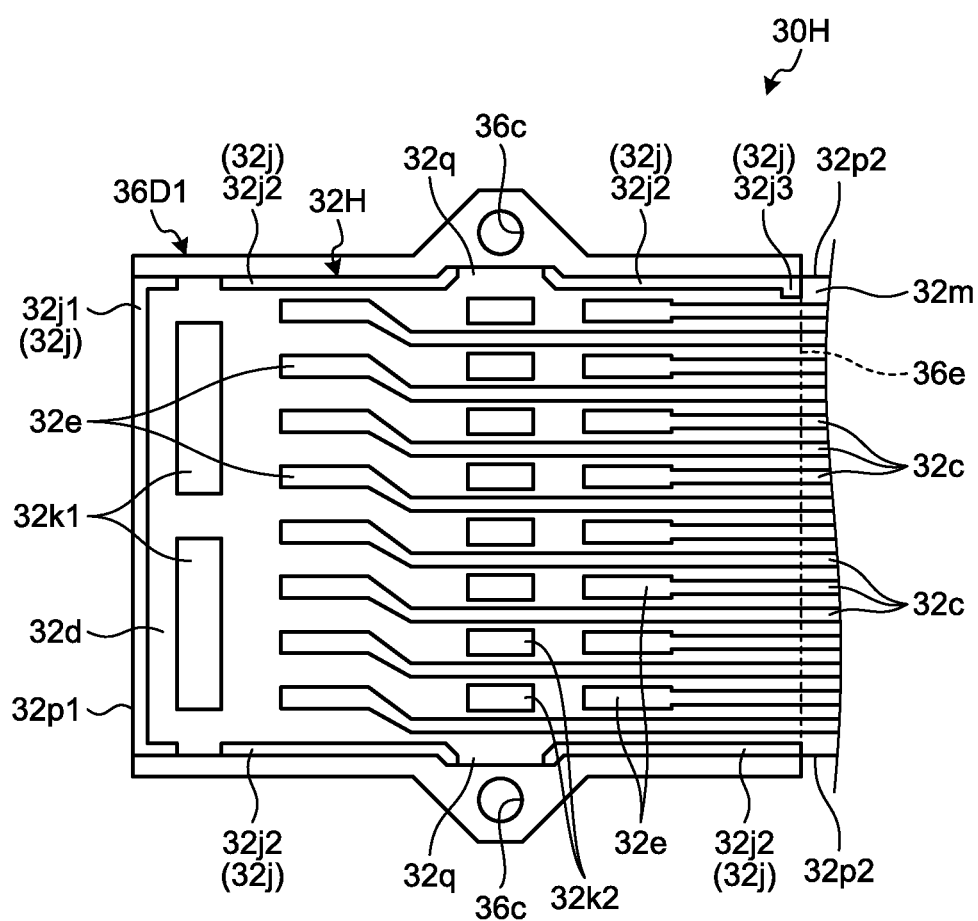
FIG. 15 is an exemplary schematic development diagram illustrating a subassembly including an FPC of a wiring assembly and reinforcement plates according to an eighth embodiment.

FIG. 15 is a development diagram of a subassembly of a wiring assembly 30H including an FPC 32H and the reinforcement plate 36D1. The HDD 100 can include the wiring assembly 30H in place of the wiring assembly 30A. In an eighth embodiment, the FPC 32H and the reinforcement plate 36D1 are also bonded to each other. The FPC 32H includes the conductor layer 32j according to the seventh embodiment, the leads 32c, and conductor layers 32k1 and 32k2 different from the conductor layer 32j. The conductor layers 32k1 and 32k2, the leads 32c, and the conductor layer 32j are laminated on the insulating layer 32d in the same process. In other words, the leads 32c and the conductor layers 32k1, 32k2, and 32j are at the same position of the FPC 32H in the thickness direction. However, the conductor layers 32k1 and 32k2 may be provided on a different layer from the conductor layer 32j and the leads 32c. The conductor layers 32k1 and 32k2 may also be electrically connected to a ground conductor (not illustrated), for example.

According to the present embodiment, the conductor layers 32k1 and 32k2 of the FPC 32H can further inhibit penetration of liquid into the FPC 32H in the thickness direction. This can further prevent the FPC 32H and the reinforcement plate 36D1 from being detached from each other. The specifications such as the position and size of the conductor layers 32k1 and 32k2 are not limited to those illustrated in FIG. 15, and various modifications can be made.

In the present embodiment, as illustrated in FIG. 15, the reinforcement plate 36D1 is provided with through holes 36c into which coupling members such as screws (not illustrated) are inserted. The FPC 32H includes protrusions 32q that extend from ends 32p2 to the through holes 36c and overlap with the heads of the coupling members. Due to the configuration as described above, by the protrusions 32q placed between the heads of the coupling members and the reinforcement plate 36D1, the FPC 32H is less likely to be detached from the reinforcement plate 36D1. The middle part 32m of the FPC 32H may be provided with a cutout, a through hole, a bottomed hole, or a slit. In this case, the middle part 32m of the FPC 32H is more easily bent, which reduces an elastic repulsive force of the bent middle part 32m. That is, the FPC 32H and the reinforcement plate 32D1 are even less likely to be detached from each other.

Ninth Embodiment

Figure 17:
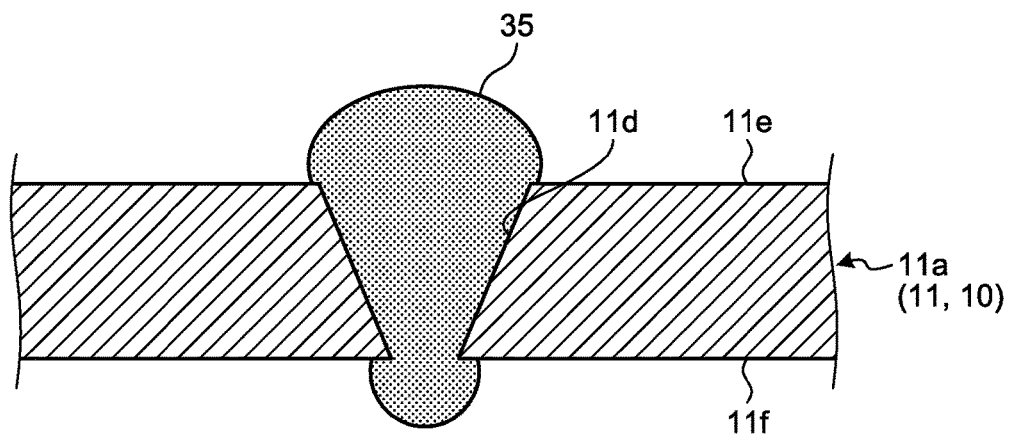
FIG. 17 is an exemplary schematic cross-sectional diagram of the casing with the opening filled with a sealant, illustrating the following step of FIG. 16 in the manufacturing method of the wiring assembly of the electronic device according to the ninth embodiment.
Figure 18:
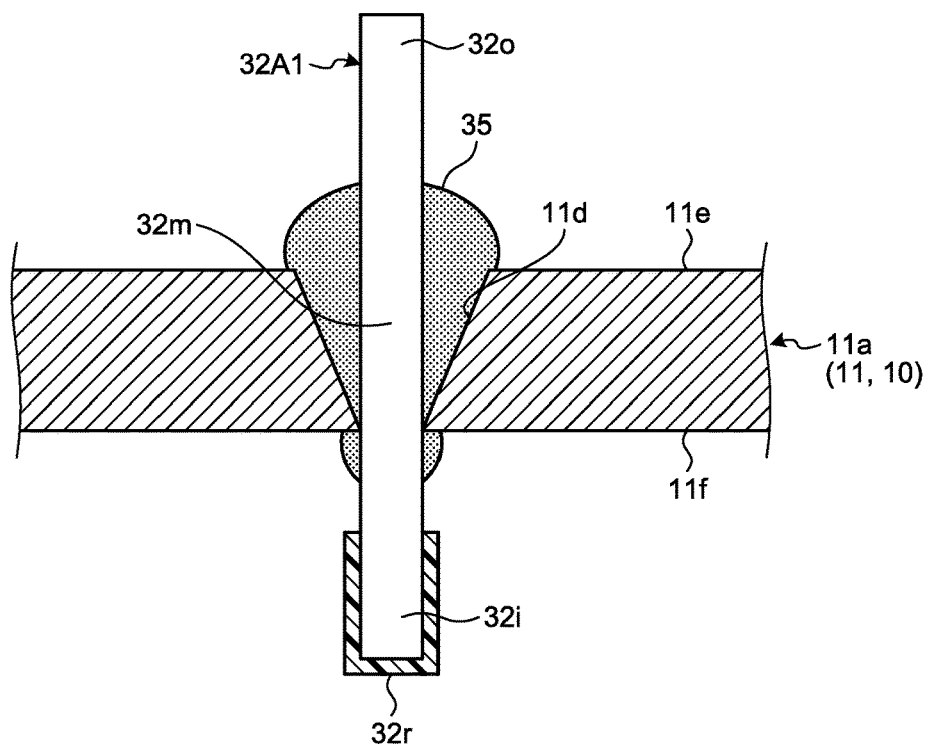
FIG. 18 is an exemplary schematic cross-sectional diagram of the casing with the opening into which a flexible wiring member is inserted, illustrating the following step of FIG. 17 in the manufacturing method of the wiring assembly of the electronic device according to the ninth embodiment.
Figure 19:
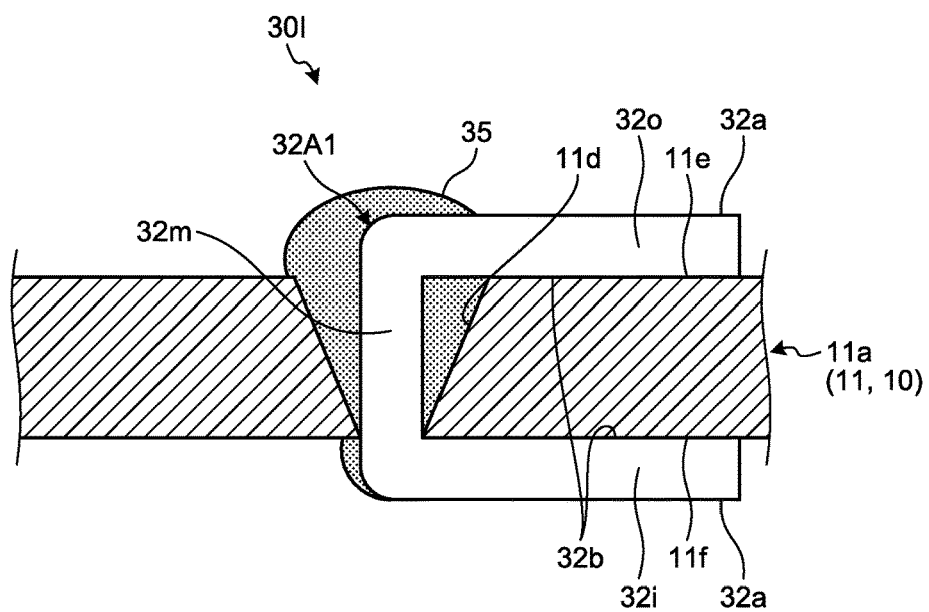
FIG. 19 is an exemplary schematic cross-sectional diagram of the wiring assembly in the casing, illustrating the following step of FIG. 18 in the manufacturing method of the wiring assembly of the electronic device according to the ninth embodiment.

FIGS. 16 to 19 are cross-sectional diagrams illustrating steps of a manufacturing method of a wiring assembly 30I (FIG. 19). The configuration of the wiring assembly 30I is almost the same as the configuration of the wiring assembly 30A in the first embodiment except for the shape of the through hole 11d.

Figure 16:
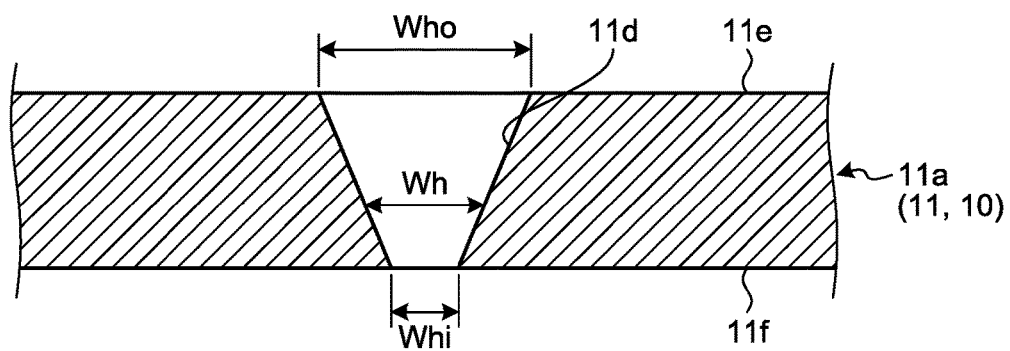
FIG. 16 is an exemplary schematic cross-sectional diagram of part of a casing with an opening, illustrating a single step of a manufacturing method of a wiring assembly of an electronic device according to a ninth embodiment.

As illustrated in FIG. 16, in a ninth embodiment, the through hole 11d in the bottom wall 11a has a greater width Who in the outer face 11e than a width Whi in the inner face 11f. A width Wh of the through hole 11d widens toward outside of the casing 10 (in the thickness direction of the bottom wall 11a, that is upward in FIG. 16). In the present embodiment, the width Wh of the through hole 11d widens gradually and smoothly. However, the width Wh may widen in a stepwise manner. As illustrated in FIGS. 18 and 19, the width Wh of the through hole 11d is in a thickness direction (a transverse direction in FIG. 16) of an FPC 32A1 that extends through the through hole 11d.

Next, as illustrated in FIG. 17, the sealant 35 in liquid form (in a soft and unset state) is injected into the through hole 11d from outside to inside of the casing 10. Because of the shape of the through hole 11d (the non-uniform width Wh described above) and the viscosity of the sealant 35, the sealant 35 remains in the through hole 11d in a state as illustrated in FIG. 17.

Next, as illustrated in FIG. 18, the FPC 32A1 is inserted into the through hole 11d and the soft sealant 35 from outside to inside of the casing 10. The configuration of the FPC 32A1 is the same as the configuration of the FPC 32A in the first embodiment except that the second section 32i is covered with a cover 32r such as a film. The cover 32r is detachably affixed to (temporarily held on) the second part 32i by an operator or through a robotic operation so as not to leave an adhesive when detached. The cover 32r is removed from the second part 32i after the second part 32i has passed through the sealant 35. That is, by the configuration and manufacturing processes of the wiring assembly 30I as described above, the sealant 35 does not attach to the second part 32i when the second part 32i passes through the through hole 11d in which the sealant 35 remains. In FIG. 18, the cover 32r is magnified in thickness for the sake of easier understanding. However, the cover 32r is so thin in practice that the second part 32i covered with the cover 32r can pass through the through hole 11d.

Next, as illustrated in FIG. 19, the FPC 32A1 is bent into a U-shape such that the first part 32o extends along the outer face 11e and the second part 32i extends along the inner face 11f. The first part 32o is fixed to the outer face 11e by bonding, for example. The second part 32i is fixed to the inner face 11f by bonding. The sealant 35 is hardened to form the wiring assembly 30I (excluding the connectors). The width Whi of one end of the through hole 11d inside the casing may be greater than the width Who of the other end of the through hole 11d outside the casing. In this case, the sealant 35 is injected from the inside end of the casing. The first part 32o may pass through the through hole 11d and the sealant 35. In this case, the first part 32o is covered with the cover 32r. The first part 32o and the second part 32i may also be both covered with the cover 32r.

The present embodiment described above can facilitate injection or application of the sealant 35 into or onto the through hole 11d, and reduce unevenness in the sealant 35 to thereby improve sealability thereof, for example. The configuration and the manufacturing method according to the present embodiment are also applicable to the through holes 11d and 36d in the other embodiments.

While embodiments and modifications of the present invention have been exemplified above, the above embodiments and modifications are only examples, and it is not intended that the present invention is limited thereto. These embodiments and modifications can be carried out in other various modes, and various types of omissions, replacements, combinations, and changes can be made without departing from the scope of the present invention. These embodiments and modifications are incorporated in the spirit and scope of the invention, and are incorporated in the inventions described in the scope of claims and their equivalents. Further, the configurations and shapes described in the respective embodiments and the respective modifications can be partially replaced with one another. The specifications of respective configurations and forms (such as constitution, type, direction, shape, size, length, width, thickness, height, number, arrangement, position, and material) can be changed as appropriate.

For example, the electronic device is not limited to an HDD. In addition, the specifications including the shape and size of the electronic device are not limited to those described in the above embodiments. The first electrical component can be any electrical component provided inside the casing, and is not limited to those described in the above embodiments. The second electrical component can be any electrical component provided outside the casing, and is not limited to those described in the above embodiments. The specifications including the shape and size of the flexible wiring member and the position of each element are not limited to those described in the above embodiments. For example, The flexible wiring member may include conductor layers and leads spaced apart from each other in the thickness direction. The flexible wiring member may extend through a wall of the casing different from the bottom wall. The casing may not be sealed hermetically and may contain air.

What is claimed is:

1. An electronic device comprising:
   a casing provided with an opening;
   a first flexible wiring member comprising an insulating film, a lead mounted on the insulating film, and a connection terminal, wherein the first flexible wiring member extends through the opening;
   a sealant filling the opening;
   a second flexible wiring member encapsulated by the casing and electrically connected to the first flexible wiring member, the second flexible wiring member comprising a connector to the connection terminal of the first flexible wiring member; and
   a first electrical component encapsulated by the casing and electrically connected to a second electrical component outside the casing through the first flexible wiring member and the second flexible wiring member.

2. The electronic device according to claim 1, wherein the first electrical component is hermetically sealed with the casing, the first flexible wiring member, and the sealant.

3. The electronic device according to claim 1, wherein the first flexible wiring member comprises a third flexible wiring member and a fourth flexible wiring member which extend in a direction away from each other in at least inside or outside of the casing.

4. The electronic device according to claim 3, wherein the third flexible wiring member and the fourth flexible wiring member are coupled in the opening.

5. The electronic device according to claim 4, further comprising:
   a connection interposed between and coupling the third flexible wiring member and the fourth flexible wiring member in the opening.

6. The electronic device according to claim 5, wherein the third flexible wiring member and the fourth flexible wiring member are electrically connected through a conductive portion which extends through a via in the connection.

7. The electronic device according to claim 1, wherein the first flexible wiring member and the second flexible wiring member are flexible printed circuit boards.

8. The electronic device according to claim 1, wherein the connection terminal of the first flexible wiring member comprises a first connection terminal inside of the casing and a second connection terminal outside of the casing.

9. The electronic device according to claim 8, wherein the first connection terminal is electrically connected to a connection terminal of the second flexible wiring member.

10. The electronic device according to claim 8, wherein the first flexible wiring member is provided on an inside surface and an outside surface of the casing.

11. An electronic device comprising:
    a casing provided with an opening;
    a partition wall provided above the opening and positioned inside or outside an outer face of the casing;
    a flexible wiring member fixed at least partially to the partition wall, comprising a first part exposed to outside the casing and a second part exposed to inside the casing, the flexible wiring member extending through a gap between the partition wall and the casing;
    a first electrical component accommodated in the casing and electrically connected to a second electrical component outside the casing through the flexible wiring member; and
    a sealant filling the gap.

12. The electronic device according to claim 11, wherein the flexible wiring member comprises a first fixed part fixed to an outer face of the partition wall, and a second fixed part fixed to an inner face of the partition wall.

13. The electronic device according to claim 12, wherein the flexible wiring member is connected to the second electrical component with a spacing from the first fixed part, or is connected to the first electrical component with a spacing from the second fixed part.

14. An electronic device comprising:
    a casing provided with an opening;
    a partition wall provided above the opening;
    a flexible wiring member fixed at least partially to the partition wall, comprising a first part exposed to outside the casing and a second part exposed to inside the casing; and
    a first electrical component accommodated in the casing and electrically connected to a second electrical component outside the casing through the flexible wiring member, wherein
    the flexible wiring member comprises a first fixed part fixed to an outer face of the partition wall, and a second fixed part fixed to an inner face of the partition wall, the flexible wiring member comprises a first flexible wiring member and a second flexible wiring member that are coupled to each other, the first fixed part of the first flexible wiring member and the first fixed part of the second flexible wiring member extend from a joint between the first flexible wiring member and the second flexible wiring member in a direction away from each other, and the second fixed part of the first flexible wiring member and the second fixed part of the second flexible wiring member extend from the joint in a direction away from each other.

15. The electronic device according to claim 14, wherein the partition wall is bonded to the flexible wiring member, and the flexible wiring member comprises a conductor layer positioned so as to overlap with an end of a bonded region between the flexible wiring member and the partition wall.

16. The electronic device according to claim 15, wherein the flexible wiring member comprises the conductor layer at a peripheral edge or at an overlapping position with a peripheral edge of the partition wall in a thickness direction of the flexible wiring member.

17. The electronic device according to claim 15, wherein the conductor layer is spaced away from a bent part of the flexible wiring member.

* * * * *

UNITED STATES PATENT AND TRADEMARK OFFICE
CERTIFICATE OF CORRECTION

PATENT NO. : 10,374,345 B2
APPLICATION NO. : 15/915707
DATED : August 6, 2019
INVENTOR(S) : Nobuhiro Yamamoto et al.

It is certified that error appears in the above-identified patent and that said Letters Patent is hereby corrected as shown below:

On the Title Page

Item (73) Assignee:
Change "TOSHIBA MEMORY CORPORATION, Tokyo (JP)"
To -- KABUSHIKI KAISHA TOSHIBA, Tokyo (JP); TOSHIBA ELECTRONIC DEVICES & STORAGE CORPORATION, Tokyo (JP) --.

Signed and Sealed this
Seventh Day of April, 2020

Andrei Iancu
*Director of the United States Patent and Trademark Office*